(12) United States Patent
Jia et al.

(10) Patent No.: US 11,880,959 B2
(45) Date of Patent: Jan. 23, 2024

(54) METHOD FOR POINT CLOUD UP-SAMPLING BASED ON DEEP LEARNING

(71) Applicant: South China University of Technology, Guangzhou (CN)

(72) Inventors: Kui Jia, Guangzhou (CN); Jiehong Lin, Guangzhou (CN); Ke Chen, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 5 days.

(21) Appl. No.: 17/418,366

(22) PCT Filed: Oct. 30, 2020

(86) PCT No.: PCT/CN2020/125380
§ 371 (c)(1),
(2) Date: Jun. 25, 2021

(87) PCT Pub. No.: WO2021/232687
PCT Pub. Date: Nov. 25, 2021

(65) Prior Publication Data
US 2022/0351332 A1   Nov. 3, 2022

(30) Foreign Application Priority Data
May 19, 2020 (CN) .......................... 202010426701.7

(51) Int. Cl.
*G06K 9/00* (2022.01)
*G06T 3/40* (2006.01)
(Continued)

(52) U.S. Cl.
CPC ............ *G06T 3/4046* (2013.01); *G06F 30/23* (2020.01); *G06T 17/20* (2013.01); *G06T 17/205* (2013.01);
(Continued)

(58) Field of Classification Search
CPC ....... G06T 3/40; G06T 3/4007; G06T 3/4023; G06T 3/4046; G06T 3/4053;
(Continued)

(56) References Cited

U.S. PATENT DOCUMENTS

| 10,262,243 B2 * | 4/2019 | Lim ...................... G06T 7/0002 |
| 11,455,748 B2 * | 9/2022 | Cai .......................... G06T 17/00 |

(Continued)

FOREIGN PATENT DOCUMENTS

| CN | 107862293 A | 3/2018 |
| CN | 110163799 A | 8/2019 |
| CN | 111724478 A | 9/2020 |

OTHER PUBLICATIONS

Yanjun Peng et al., "Sparse-to-Dense Multi-Encoder Shape Completion of Unstructured Point Cloud", IEEE Access, vol. 8, Feb. 2020, pp. 30969-30978 (Year: 2020).*

(Continued)

*Primary Examiner* — Eric Rush
(74) *Attorney, Agent, or Firm* — Epstein Drangel LLP; Robert L. Epstein

(57) ABSTRACT

The present invention discloses a method for point cloud up-sampling based on deep learning, including: obtaining training data including a first number of sparse input points and a second number of dense input points; constructing a deep network model to be used for respectively performing replication and sampling operation based on curvature on initial eigenvectors extracted from the first number of sparse input points to obtain a second number of intermediate eigenvectors, performing splicing operation on each intermediate eigenvector, inputting the spliced intermediate eigenvectors into a multilayer perceptron, and determining sampling prediction points based on the sampling eigenvectors output by the multilayer perceptron; training the deep network model until an objective function determined by the (Continued)

sampling prediction points and the dense input points converges; and testing the deep network model to obtain point cloud data of an object under test after up-sampling.

4 Claims, 2 Drawing Sheets

(51) Int. Cl.
*G06F 30/23* (2020.01)
*G06T 17/20* (2006.01)

(52) U.S. Cl.
CPC ............ *G06T 2207/10028* (2013.01); *G06T 2207/20081* (2013.01); *G06T 2219/2016* (2013.01)

(58) Field of Classification Search
CPC ....... G06T 15/005; G06T 17/00; G06T 17/20; G06T 17/205; G06T 17/30; G06T 19/20; G06T 2207/10028; G06T 2207/20081; G06T 2207/20084; G06T 2210/56; G06T 2219/20; G06T 2219/2016; G06F 18/21; G06F 18/217; G06F 18/2193; G06F 18/27; G06F 30/10; G06F 30/20; G06F 30/23; G06F 30/27; G06V 10/70; G06V 10/766; G06V 10/82; G06V 20/64; G06N 3/02; G06N 3/08; G06N 3/082; G06N 3/09; G06N 3/0985

USPC ................ 382/100, 106, 154–159, 298–300; 345/419, 420, 428, 441, 442, 581, 586, 345/606, 611, 613, 660, 664, 667–669, 345/671; 706/15–17, 19–22
See application file for complete search history.

(56) References Cited

U.S. PATENT DOCUMENTS

| | | |
|---|---|---|
| 2013/0151210 A1 | 6/2013 | Kallay et al. |
| 2018/0089536 A1 | 3/2018 | Feng et al. |
| 2022/0180543 A1* | 6/2022 | Ling ................ G06T 7/521 |

OTHER PUBLICATIONS

Edoardo Remelli, Pierre Baque, Pascal Fua, "NeuralSampler: Euclidean Point Cloud Auto-Encoder and Sampler", arXiv, arXiv: 1901.09394v1, Jan. 2019, pp. 1-9 (Year: 2019).*
Lequan Yu et al., "PU-Net: Point Cloud Upsampling Network", arXiv, arXiv:1801.06761v2, Mar. 2018, pp. 1-15 (Year: 2018).*
Wentao Yuan et al., "PCN: Point Completion Network", arXiv, arXiv:1808.00671v3, Sep. 2019, pp. 1-17 (Year: 2019).*
Wentai Zhang et al., "Data-driven Upsampling of Point Clouds", arXiv, arXiv:1807.02740v1, Dec. 2018, pp. 1-17 (Year: 2018).*
Adaptive up-sampling algorithm of point cloud model; Application Research of Computers Yang Bina, Fan Yuan-yuan; vol. 29 No. 6 Jun. 2012, China Academic Journal, Electronic Publishing House.

* cited by examiner

METHOD FOR POINT CLOUD UP-SAMPLING BASED ON DEEP LEARNING

TECHNICAL FIELD

The present invention relates to the technical field of computer vision, and in particular, to a method for point cloud up-sampling based on deep learning.

BACKGROUND

As depth cameras and lidar sensors become popular, a point cloud as a simple and efficient 3D data representation gradually draws extensive attention from researchers. In recent years, since researchers have utilized end-to-end neural networks to directly process original point cloud data, a qualitative breakthrough has been made on vision tasks (e.g., recognizing and detecting a 3D object and segmenting a 3D scene) based on point cloud representation. However, original point cloud data is usually generated by consumer-level scanning devices, so there are problems such as sparsity, incompleteness, and noise interference, which bring a heavy test to semantic analysis of a point cloud. Hence, to be used for rendering, analysis or other processing more efficiently, it is necessary to repair the original data and improve the quality of the data. Point cloud up-sampling is a representative technology to alleviate such problems.

Given a sparse and incomplete point cloud, point cloud up-sampling needs to generate a dense and complete point cloud and enable the generated point cloud to fit a latent surface of an object. Currently, in common solutions, a dense and uniform up-sampling point cloud is generated by replicating point cloud features. Nevertheless, in most cases, it is obvious that a point cloud, if uniformly distributed, fails to nicely express or describe a potential shape of an object. For example, in the case of representing a chair, a joint of the chair and a surface of the chair provide the same number of sampling points if a uniform sampling method is adopted. However, due to the large curvature of the joint, the partial description is prone to not be in place, resulting in inaccurate representation of an outline of the object.

SUMMARY

To solve the technical problem that an outline of an object cannot be accurately represented in the related technologies, the present invention provides a method for point cloud up-sampling based on deep learning.

A first aspect of embodiments of the present invention discloses a method for point cloud up-sampling based on deep learning, including:
  step 1: obtaining training data, where the training data includes a first number of sparse input points and a second number of dense input points, the sparse input points are uniformly sampled from a CAD model, and the dense input points are sampled from the CAD model based on curvature;
  step 2: constructing a deep network model, where the deep network model is used for extracting initial eigenvectors from the first number of sparse input points, respectively performing replication operation and sampling operation based on curvature features on the initial eigenvectors to obtain a second number of intermediate eigenvectors, performing splicing operation on each intermediate eigenvector, inputting the spliced intermediate eigenvectors into a multilayer perceptron to obtain a second number of sampling eigenvectors, and determining a second number of sampling prediction points according to the second number of sampling eigenvectors;
  step 3: training the deep network model, determining an objective function according to the sampling prediction points and the dense input points, and adjusting parameters of the deep network model based on the objective function until the objective function converges; and
  step 4: testing the deep network model, sampling several seed points from point cloud representation of an object under test, constructing an input point cloud to be tested from each seed point and neighborhood points thereof, inputting the input point clouds to be tested into the trained deep network model to obtain a test point cloud corresponding to each input point cloud to be tested, and aggregating all the test point clouds to obtain point cloud data of the object under test after up-sampling.

As an optional implementation, in the first aspect of the embodiments of the present invention, the deep network model includes a feature extraction module, a feature sampling module and a coordinate regression module, where
  the feature extraction module is configured to extract eigenvectors of all the sparse input points received by the deep network model to obtain the initial eigenvectors of the first number of sparse input points;
  the feature sampling module is configured to replicate the first number of initial eigenvectors to obtain a third number of first eigenvectors, determine a sampling probability according to the curvature of each sparse input point, perform sampling according to the sampling probability to obtain a fourth number of second eigenvectors, determine a second number of intermediate eigenvectors according to all the first eigenvectors and all the second eigenvectors, splice a 2D vector generated by a 2D mesh mechanism onto each intermediate eigenvector, and input the spliced intermediate eigenvectors into the multilayer perceptron to obtain a second number of sampling eigenvectors, where the 2D vectors spliced onto the same eigenvectors of the intermediate eigenvectors are different.

The coordinate regression module is configured to determine a second number of sampling prediction points according to the second number of sampling eigenvectors.

As an optional implementation, in the first aspect of the embodiments of the present invention, the determining an objective function according to the sampling prediction points and the dense input points includes:
  determining a reconstruction loss according to the distance between the sampling prediction points and the dense input points;
  determining a curvature-aware loss according to a relationship between the curvature of a random point on a sampling prediction point cloud and the area of a neighborhood of the random point;
  determining a smoothness loss according to a geometric relationship of the random point on the sampling prediction point cloud relative to the neighborhood of the random point on the dense input point cloud; and
  determining the objective function according to the reconstruction loss, the curvature-aware loss and the smoothness loss.

The sampling prediction point cloud consists of the second number of sampling prediction points, and the dense input point cloud consists of the second number of dense input points.

As an optional implementation, in the first aspect of the embodiments of the present invention, the determining the objective function according to the reconstruction loss, the curvature-aware loss and the smoothness loss includes:

obtaining the objective function from a weighted sum of the reconstruction loss, the curvature-aware loss and the smoothness loss.

A second aspect of the embodiments of the present invention discloses a computer-readable storage medium that stores a computer program, where the computer program enables a computer to implement the method for point cloud up-sampling based on deep learning disclosed in the first aspect of the embodiments of the present invention.

A third aspect of embodiments of the present invention discloses an electronic device, including:

a processor; and a memory, where the memory stores computer-readable instructions, and the method as described above is implemented when the computer-readable instructions are executed by the processor.

The technical solution provided by the embodiments of the present invention may have the beneficial effects as below.

The method for point cloud up-sampling based on deep learning provided by the present invention includes the following steps: step 1: obtaining training data, where the training data includes the first number of sparse input points and the second number of dense input points, the sparse input points are uniformly sampled from the CAD model, and the dense input points are sampled from the CAD model based on the curvature; step 2: constructing a deep network model, where the deep network model is used for extracting the initial eigenvectors of the first number of sparse input points, respectively performing replication operation and sampling operation based on the curvature features on the initial eigenvectors to obtain the second number of intermediate eigenvectors, performing splicing operation on each intermediate eigenvector, inputting the spliced intermediate eigenvectors into the multilayer perceptron to obtain the second number of sampling eigenvectors, and determining the second number of sampling prediction points according to the second number of sampling eigenvectors; step 3: training a deep network model, determining the objective function according to the sampling prediction points and the dense input points, and adjusting the parameters of the deep network model based on the objective function until the objective function converges; and step 4: testing the deep network model, sampling the several seed points from point cloud representation of the object under test, constructing the input point cloud to be tested from each seed point and neighborhood points thereof, inputting the input point clouds to be tested into the trained deep network model to obtain the test point cloud corresponding to each input point cloud to be tested, and aggregating all the test point clouds to obtain point cloud data of the object under test after up-sampling.

In this method, by designing the feature sampling module based on curvature adaptation on a neural network, a sparse point cloud can be converted into a dense point cloud with density distribution based on curvature adaptation, and the outline of the object can be more accurately represented, thereby more facilitating expressing, rendering and visualizing 3D data.

It should be understood that general description above and detailed description below are only exemplary and cannot limit the present invention.

BRIEF DESCRIPTION OF DRAWINGS

The accompanying drawings, which are incorporated in and constitute a part of this specification, illustrate embodiments consistent with the present invention and, together with the specification, serve to explain the principles of the present invention.

DESCRIPTION OF EMBODIMENTS

Reference will now be made in detail to the exemplary embodiments, examples of which are illustrated in the accompanying drawings. When the following description refers to the accompanying drawings, like numerals in different drawings indicate the same or similar elements, unless otherwise indicated. The implementations described in the following exemplary embodiments do not represent all implementations consistent with the present invention. Rather, they are merely examples of apparatuses and methods consistent with some aspects of the present invention as detailed in the appended claims.

Figure 1:
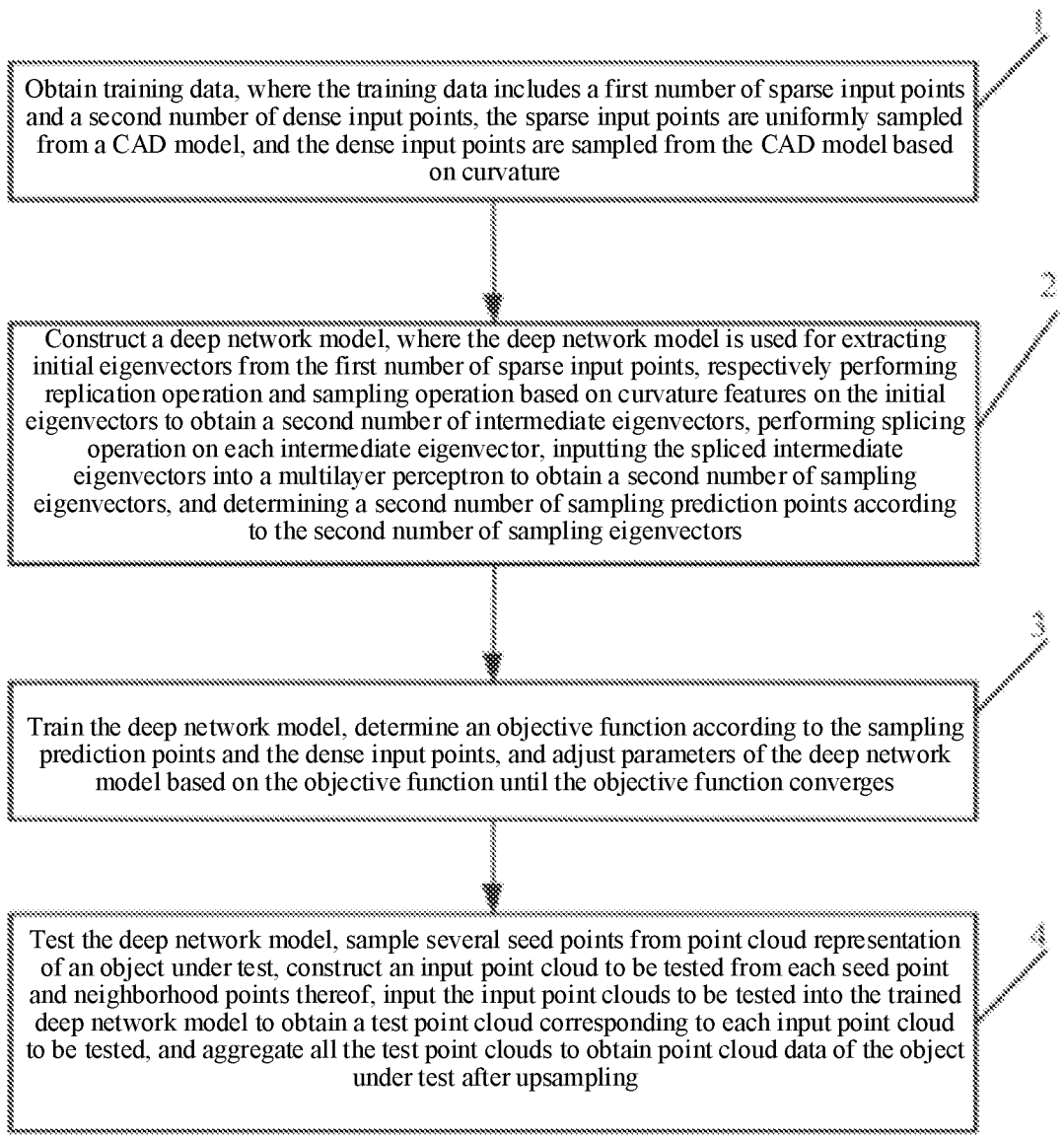
FIG. 1 is a flowchart of a method for point cloud up-sampling based on deep learning as illustrated according to one exemplary embodiment.

FIG. 1 is a flowchart of a method for point cloud up-sampling based on deep learning as illustrated according to one exemplary embodiment. As shown in FIG. 1, the method includes the following steps.

Step 1: Obtain training data, where the training data includes a first number of sparse input points and a second number of dense input points, the sparse input points are uniformly sampled from a CAD model, and the dense input points are sampled from the CAD model based on curvature.

In the embodiments of the present invention, the sparse input points and the dense input points can all be sampled from the CAD (Computer Aided Design) model. Specifically, the first number may be 256, the second number may be 1024, then each mesh data for the object may be cut into slices, 256 points are uniformly sampled from each slice to serve as the sparse input points (a sparse input point cloud P), and the curvature of each sparse input point is estimated; and furthermore, a sampling probability is determined according to the curvature of each sparse input point, 1024 points are sampled according to the sampling probability to serve as the dense input points (a dense ground truth point cloud Q), and a normal vector of each point is estimated.

Step 2: Construct a deep network model, where the deep network model is used for extracting initial eigenvectors from the first number of sparse input points, respectively performing replication operation and sampling operation based on curvature features on the initial eigenvectors to obtain a second number of intermediate eigenvectors, performing splicing operation on each intermediate eigenvector, inputting the spliced intermediate eigenvectors into a multilayer perceptron to obtain a second number of sampling eigenvectors, and determining a second number of sampling prediction points according to the second number of sampling eigenvectors.

In the embodiments of the present invention, the deep network model is constructed to initiate parameters of the model. Specifically, the deep network model may include a feature extraction module, a feature sampling module and a coordinate regression module.

The feature extraction module is configured to extract eigenvectors of all the sparse input points received by the deep network model to obtain the initial eigenvectors of the first number of sparse input points.

In the embodiments of the present invention, for example, the first number may be 256, then the feature extraction module can put the sparse input points as an input, the sparse input point cloud includes the 256 sparse input points, local geometric information of all the sparse input points in the input is aggregated by dense connections of a network, and features (eigenvectors) with rich semantic information are extracted for each sparse input point. Further, the feature extraction module can provide the extracted initial eigenvectors of all the sparse input points for the feature sampling module.

The feature sampling module is configured to replicate a first number of initial eigenvectors to obtain a third number of first eigenvectors, determine a sampling probability according to the curvature of each sparse input point, perform sampling according to the sampling probability to obtain a fourth number of second eigenvectors, determine the second number of intermediate eigenvectors according to all the first eigenvectors and all the second eigenvectors, splice a 2D vector generated by a 2D mesh mechanism onto each intermediate eigenvector, and input the spliced intermediate eigenvectors into the multilayer perceptron to obtain the second number of sampling eigenvectors, where the 2D vectors spliced onto the same eigenvectors of the intermediate eigenvectors are different.

In the embodiments of the present invention, taking the first number being 256, the second number being 1024, the third number being 512 and the fourth number being 512 as an example, the feature sampling module based on curvature adaptation can respectively perform replication and sampling operation based on curvature features on the initial eigenvectors of the 256 sparse input points output by the feature extraction module above to obtain the 1024 intermediate eigenvectors. Sampling is divided into two parts: firstly, the initial eigenvectors of the 256 sparse input points are directly replicated to obtain the 512 first eigenvectors, where this part of eigenvectors can be used for keeping the basic shape of the object; secondly, the sampling probability is determined according to the curvature of the sparse input points corresponding to the features, and another 512 second eigenvectors are sampled according to the sampling probability, where this part of second eigenvectors can be used for further depicting the details of the object; all the first eigenvectors and all the second eigenvectors are determined as the intermediate eigenvectors, i.e., the 1024 intermediate eigenvectors, and the 2D vectors generated by the 2D mesh mechanism are further spliced onto each intermediate eigenvector, where the 2D vectors spliced onto the same eigenvectors of the intermediate eigenvectors are different from one another, to increase diversity of the features; and more further, all the spliced intermediate eigenvectors with the 2D vectors are input into the Multilayer Perceptron to obtain the 1024 sampling eigenvectors, where the multilayer perceptron can further enrich information of the 1024 sampling eigenvectors.

It should be illustrated that the third number plus the fourth number equals the second number and the third number and the fourth number may be equal or unequal, which are not limited in the embodiments of the present invention.

The coordinate regression module is configured to determine the second number of sampling prediction points according to the second number of sampling eigenvectors.

In the embodiments of the present invention, taking the second number being 1024 as an example, the 1024 sampling vectors correspond to information of the 1024 up-sampling prediction points, and coordinates of the 1024 up-sampling prediction points are regressed directly by a fully connected layer.

Step 3: Train a deep network model, determine an objective function according to the sampling prediction points and the dense input points, and adjust parameters of the deep network model based on the objective function until the objective function converges.

In the embodiments of the present invention, under the supervision of the objective function, the parameters of the deep network model are optimized and updated by the application of stochastic gradient descent.

Step 4: Test the deep network mode, sample several seed points from point cloud representation of an object under test, construct an input point cloud to be tested from each seed point and neighborhood points thereof, input the input point clouds to be tested into the trained deep network model to obtain a test point cloud corresponding to each input point cloud to be tested, and aggregate all the test point clouds to obtain point cloud data of the object under test after up-sampling.

In the embodiments of the present invention, optionally, several seed points can be sampled from the point cloud representation of the object under test by the application of farthest point sampling.

As an optional implementation, the step 3 that the deep network model is trained may include the following steps.

Step 31: Determine the objective function according to the sampling prediction points and the dense input points.

Step 32: Adjust the parameters of the deep network model based on the objective function until the objective function converges.

Figure 2:
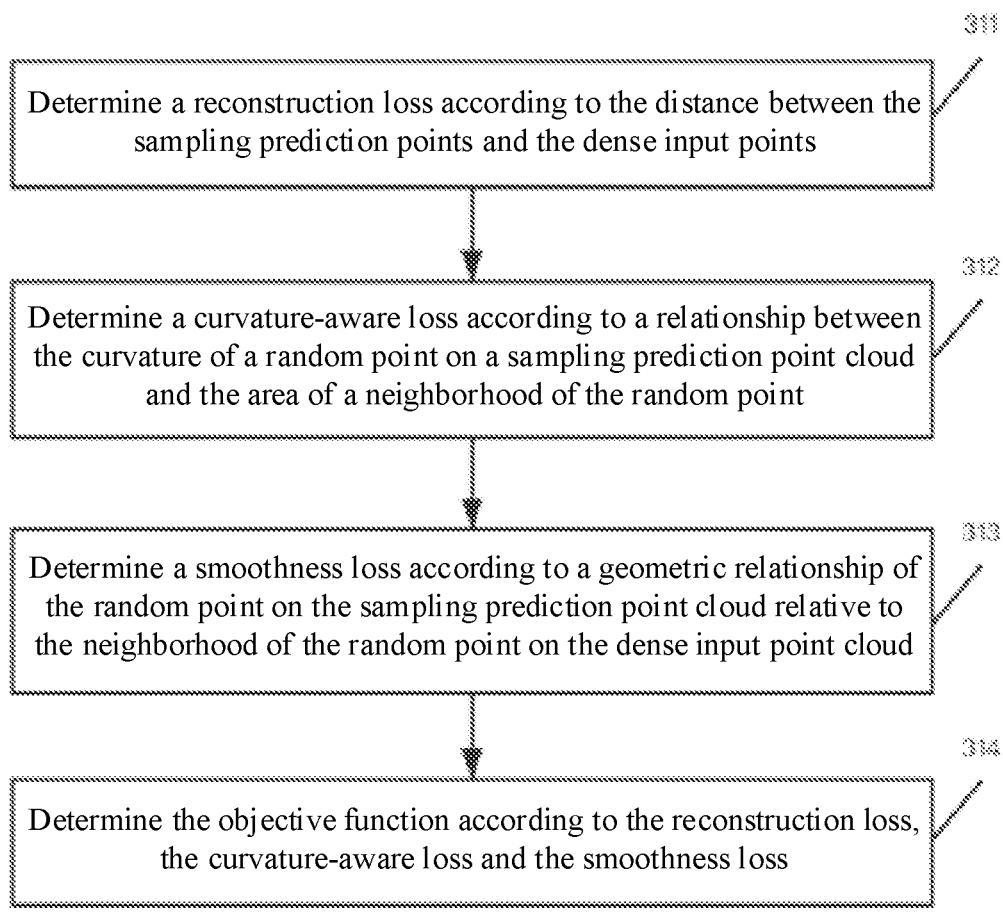
FIG. 2 is a flowchart of determining an objective function according to sampling prediction points and dense input points in the method as illustrated in FIG. 1.

Further, optionally, also referring to FIG. 2, FIG. 2 is the flowchart of the step that the objective function is determined according to the sampling prediction points and the dense input points in the method as illustrated in FIG. 1. As shown in FIG. 2, step 31 may specifically include the following steps:

Step 311: Determine a reconstruction loss according to the distance between the sampling prediction points and the dense input points.

Step 312: Determine a curvature-aware loss according to the curvature of a random point on a sampling prediction point cloud and the area of a neighborhood of the random point.

Step 313: Determine a smoothness loss according to a relationship between a geometric relationship of the random point on the sampling prediction point cloud relative to the neighborhood of the random point on the dense input point cloud.

Step 314: Determine the objective function according to the reconstruction loss, the curvature-aware loss and the smoothness loss.

The sampling prediction point cloud consists of the second number of sampling prediction points, and the dense input point cloud consists of the second number of dense input points.

Further, optionally, the objective function can be obtained from a weighted sum of the reconstruction loss, the curvature-aware loss and the smoothness loss.

In the embodiments of the present invention, the objective function $L_{up}$ is obtained from the weighted sum of the three Losses:

$$L_{up}=\lambda_{rec}L_{rec}+\lambda_{cur}L_{cur}+\lambda_{smo}L_{smo}$$

where $L_{rec}$, $L_{cur}$ and $L_{smo}$ represent the reconstruction loss, the curvature-aware loss and the smoothness loss respectively; and $\lambda_{rec}$, $\lambda_{cur}$ and $\lambda_{smo}$ represent corresponding weights respectively and are used for balancing the three Losses.

The sampling prediction point cloud is set as Q and the dense input point cloud (also named Ground Truth point cloud) is set as $\hat{Q}$. Accordingly:

(a) Reconstruction loss: the reconstruction loss is determined according to the distance between the sampling prediction points and the dense input points. Specifically, the reconstruction loss functions to reduce the difference between the sampling prediction point cloud Q and the dense input point cloud $\hat{Q}$ and keep the basic shape of the sampling prediction point cloud Q (up-sampling point cloud). EMD (Earth Mover's distance) is adopted herein as the reconstruction loss:

$$L_{rec} = \min_{\phi: Q \to \hat{Q}} \sum_{q_i \in Q} \|q_i - \phi(q_i)\|_2$$

where $\phi: Q \to \hat{Q}$ indicates bidirectional mapping.

(b) curvature-aware loss: the curvature-aware loss is determined according to the curvature of the random point on the sampling prediction point cloud and the area of the neighborhood of the random point. Specifically, the curvature-aware loss functions to enable the network to generate the dense point cloud with distributed based on curvature. The computational formula is as below:

$$L_{cur} = \frac{1}{rN} \sum_{q \in Q} \frac{1}{k} \sum_{x \in N(q)} |<(x-q), n_q>|$$

where <.> represents an inner product, and N(q) represents a neighborhood of the point q that consists of k neighborhood points of the point q. $n_q$ represents the normal vector of the point q, and $|<(x-q), n_q>|$ represents the distance from the point $x \in N(q)$ to a tangent plane of the point q. Therefore, the curvature-aware loss controls the area of the neighborhood of the random point q to realize curvature adaptation, when the point q has a large curvature, the neighborhood defined by the k neighborhood points should occupy a smaller area, and when the point q has a small curvature, the neighborhood should occupy a larger area.

(c) Smoothness loss: the smoothness loss is determined according to the geometric relationship of the random point on the sampling prediction point cloud relative to the neighborhood of the random point on the dense input point cloud. Specifically, the smoothness loss functions to ensure the smoothness of a local geometric surface of the up-sampling point cloud and effectively restrain stray points. The computational formula is as below:

$$L_{smo} = \frac{1}{rN} \sum_{q \in Q} \frac{1}{k} \sum_{\hat{x} \in N'(q)} \left| < \frac{\hat{x}-q}{|\hat{x}-q|}, n_{\hat{x}} > \right|$$

where N'(q) represents a neighborhood defined by the point q on the dense input point cloud (ground truth point cloud) $\hat{Q}$ that consists of k neighborhood points of the point q on $\hat{Q}$. As for a neighborhood point $\hat{x} \in N(q)$, if $\hat{Q}$ is smooth and dense enough and q and $\hat{x}$ are quite approximate, it can be deemed that the point q and the neighborhood point belong to the same plane. By minimizing the inner product of two unit vectors $$\frac{\hat{x}-q}{|\hat{x}-q|}$$

and $n\hat{x}$, these two vectors can tend to be orthogonal. Therefore, the smoothness loss can function to translate the point q to a local surface defined by the N'(q), to realize local smoothness of the up-sampling point cloud.

It can be seen by implementing the method for point cloud up-sampling based on deep learning as described in FIG. 1 and FIG. 2 that by designing the feature sampling module based on curvature adaptation on the neural network, the sparse point cloud can be converted into the dense point cloud with density distribution based on curvature adaptation, and the outline of the object can be more accurately represented, thereby more facilitating expressing, rendering and visualizing 3D data.

In one exemplary embodiment, the present invention further provides a computer-readable storage medium that stores a computer program, where the method for point cloud up-sampling based on deep learning as illustrated above is implemented when the computer program is executed by a processor.

It should be understood that the present invention is not limited to the precise structure as described above and illustrated in the accompanying drawings, and various modifications and variations can be made without departing from the scope of the present invention. The scope of the present invention is only defined by the appended claims.

What is claimed is:

1. A method for point cloud up-sampling based on deep learning, comprising:

step 1: obtaining training data, wherein the training data comprises a first number of sparse input points and a second number of dense input points, the first number of sparse input points are uniformly sampled from a Computer Aided Design (CAD) model, and the second number of dense input points are sampled from the CAD model based on curvature;

step 2: constructing a deep network model, wherein the deep network model is used for extracting initial eigenvectors from the first number of sparse input points, respectively performing a replication operation and a sampling operation based on curvature features on the initial eigenvectors to obtain a second number of intermediate eigenvectors, performing a splicing operation on each intermediate eigenvector of the second number of intermediate eigenvectors, inputting the spliced intermediate eigenvectors into a multilayer perceptron to obtain a second number of sampling eigenvectors, and determining a second number of sampling prediction points according to the second number of sampling eigenvectors;

step 3: training the deep network model, determining an objective function according to the second number of sampling prediction points and the second number of dense input points, and adjusting parameters of the deep network model based on the objective function until the objective function converges; and step 4: testing the deep network model, sampling several seed points from a point cloud representation of an object under test, respectively constructing an input point cloud to be tested from each seed point of the several seed points and neighborhood points thereof, inputting the input point clouds to be tested into the trained deep network model to obtain a test point cloud corresponding to each of the input point clouds to be tested respectively, and aggregating all of the test point clouds to obtain point cloud data of the object under test after up-sampling.

2. The method of claim 1, wherein the deep network model comprises a feature extraction module, a feature sampling module and a coordinate regression module, wherein the feature extraction module is configured to extract eigenvectors from all of the first number of sparse input points received by the deep network model to obtain the initial eigenvectors of the first number of sparse input points;

the feature sampling module is configured to replicate the-initial eigenvectors to obtain a third number of first eigenvectors, determine a sampling probability according to a curvature of each sparse input point of the first number of sparse input points, perform sampling according to the sampling probability to obtain a fourth number of second eigenvectors, determine the second number of intermediate eigenvectors according to all of the third number of first eigenvectors and all of the fourth number of second eigenvectors, splice a 2D vector generated by a 2D mesh mechanism onto each intermediate eigenvector of the second number of intermediate eigenvectors, and input the spliced intermediate eigenvectors into the multilayer perceptron to obtain the second number of sampling eigenvectors, wherein the 2D vectors spliced onto each intermediate eigenvector of the second number of intermediate eigenvectors are different; and the coordinate regression module is configured to determine the second number of sampling prediction points according to the second number of sampling eigenvectors.

3. The method of claim 1, wherein the determining an objective function according to the second number of sampling prediction points and the second number of dense input points comprises:

determining a reconstruction loss according to a distance between the second number of sampling prediction points and the second number of dense input points;

determining a curvature-aware loss according to a relationship between a curvature of a random point on a sampling prediction point cloud and an area of a neighborhood of the random point;

determining a smoothness loss according to a geometric relationship of the random point on the sampling prediction point cloud relative to a neighborhood of the random point on a dense input point cloud; and determining the objective function according to the reconstruction loss, the curvature-aware loss and the smoothness loss;

wherein the sampling prediction point cloud consists of the second number of sampling prediction points, and the dense input point cloud consists of the second number of dense input points.

4. The method of claim 3, wherein the determining the objective function according to the reconstruction loss, the curvature-aware loss and the smoothness loss comprises:

obtaining the objective function from a weighted sum of the reconstruction loss, the curvature-aware loss and the smoothness loss.

* * * * *